(12) United States Patent
Kondo et al.

(10) Patent No.: US 6,426,133 B1
(45) Date of Patent: Jul. 30, 2002

(54) GRAPHITE MATERIAL COATED WITH SILICON CARBIDE

(75) Inventors: Akira Kondo, Tigard, OR (US); Neil Salstrom, Camas, WA (US)

(73) Assignees: Tokai Carbon Company, Ltd., Tokyo (JP); Seh America, Inc., Vancouver, WA (US)

(*) Notice: Subject to any disclaimer, the term of this patent is extended or adjusted under 35 U.S.C. 154(b) by 0 days.

(21) Appl. No.: 09/553,818

(22) Filed: Apr. 21, 2000

(30) Foreign Application Priority Data

May 7, 1999 (JP) .......................................... 11-126580

(51) Int. Cl.[7] ................................................ B32B 7/02
(52) U.S. Cl. ...................... 428/213; 428/212; 428/216; 428/220; 428/332; 428/334; 428/337; 428/339
(58) Field of Search .................................. 428/212, 213, 428/215, 216, 220, 312.6, 332, 334, 337, 339

Primary Examiner—Merrick Dixon
(74) Attorney, Agent, or Firm—Flynn, Thiel, Boutell & Tanis, P.C.

(57) ABSTRACT

A graphite material coated with silicon carbide which exhibits superior physical impact resistance and can be manufactured at low cost. The material includes a graphite substrate coated with a silicon carbide film with a thickness of 30–50 $\mu$m, wherein a mixed layer of graphite and silicon carbide with a thickness of 10–500 $\mu$m is provided from the interface of the graphite substrate and the silicon carbide film through the inside of the graphite substrate, and the silicon carbide film has a peel strength of 5 Mpa or more. The silicon carbide film is attached preferably by the CVD method and is suitably used as a material for an apparatus for drawing-up single crystals of silicon.

5 Claims, 1 Drawing Sheet

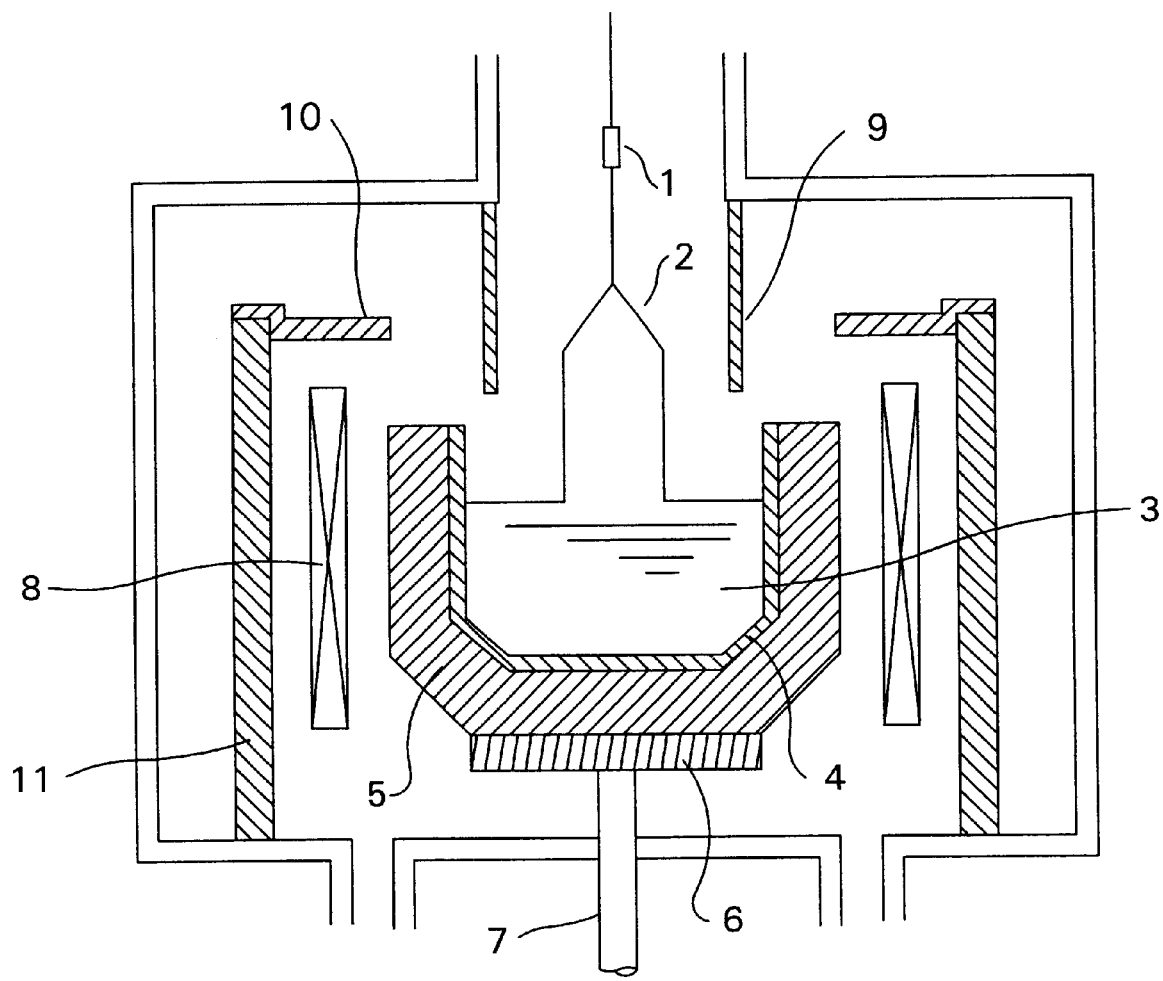

GRAPHITE MATERIAL COATED WITH SILICON CARBIDE

BACKGROUND OF THE INVENTION

1. Field of the Invention

The present invention relates to a graphite material coated with a silicon carbide film, and, more particularly, to a graphite material coated with silicon carbide which can be suitably used for various parts in an apparatus for drawing-up single crystals of silicon by the CZ method, for example.

2. Description of Background Art

Single crystals of silicon used for the manufacture of ICs and LSIs have conventionally been produced by the CZ method. As shown in FIG. 1, in an apparatus for drawing-up single crystals of silicon by the CZ method, silicon polycrystals are placed in a high purity quartz crucible 4 and melted by heating using a graphite heater 8. A seed crystal 1 (a single crystal) attached to the top of a drawing axis is dipped into a molten silicon polycrystal fluid 3 and slowly drawn up while being rotated around a rotation axis 7, whereby the molten silicon polycrystal fluid 3 is coagulated and a single silicon crystal 2 is grown at the bottom edge of the seed crystal 1.

Because the quartz crucible 4 has insufficient strength and becomes soft at a high temperature, the quartz crucible 4 is reinforced by being engaged in a graphite crucible 5. In addition, a graphite material which is stable under high temperature conditions is used for a gas rectification pipe 9, a heat shielding member 10, a thermal insulation pipe 11, and the like. In this manner, many graphite members are used in the apparatus for drawing-up single silicon crystals.

In the operation for drawing up a single silicon crystal, molten silicon and quartz react in the apparatus according to the following reaction formula (1) to produce SiO gas.

$$Si+SiO_2 \rightarrow 2SiO\ (g) \tag{1}$$

The SiO gas produced reacts with the graphite material in the apparatus and is converted into SiC gas, while generating CO gas.

$$SiO\ (g)+2C \rightarrow SiC+CO\ (g) \tag{2}$$

In this manner, the graphite material in the apparatus is gradually eroded by SiO gas. The CO gas produced is dissolved in molten silicon and increases the content of carbon in the drawn-up single silicon crystal. This impairs the characteristics of the single silicon crystal as a semiconductor. In addition, SiC produced on the surface of the graphite material causes fine cracks, resulting in a short life for the material.

As a method for overcoming these problems, a technology of suppressing the reaction between the graphite material and SiO gas by covering the graphite material with silicon carbide has been known. For example, Japanese Patent Application Laid-open No. 58-172292 discloses a heat generating body for the apparatus for drawing-up single silicon crystals which comprises a silicon carbide layer formed over the surface of the graphite material. Japanese Patent Application Laid-open No. 58-172295 discloses an apparatus for drawing-up single silicon crystals which has a silicon carbide layer provided between a quartz crucible and a graphite crucible.

Japanese Patent Application Laid-open No. the following rewritten paragraph: 62–138386 discloses an apparatus for drawing-up single silicon crystals by the CZ method, which is provided with a radiation screen with a shape similar to a reverse cone surrounding the single crystal rod, with the bottom opening proximate to the molten liquid surface, and the upper end being in the shape of an outwardly expanding triangle or a circular rim configuration curved like an arrow which covers the top of the crucible. The inner and outer surfaces of the radiation screen is made from silicon carbide, silicon nitrite, or boron nitride, and the intermediate layer has a thermal insulating complex layer structure made from a carbon felt.

Japanese Patent Application Laid-open No. 5-221758 discloses a graphite material coated with silicon carbide by chemical vapor deposition, wherein the silicon carbide film thickness of the region where cracks are easily produced is 60–90 μm, which is 50–75% of the average film thickness of the entire film.

Silicon carbide (SiC) coating the graphite material reacts with SiO gas according to the following reaction formula (3). However, because the reaction is initiated at about 1820° C., which is higher than the melting point of silicon (1420° C.), the reaction of the formula (3) does not take place when single silicon crystals are drawn up, thereby preventing the surface of the graphite material from deteriorating.

$$SiC+SiO\ (g) \rightarrow 2Si+CO\ (g) \tag{3}$$

Therefore, coating a graphite material member with silicon carbide prevents the reaction of graphite and SiO gas, and ensures stable operation of the apparatus. However, this involves an increase in the manufacturing cost. Specifically, although the thicker the SiC film, the more stable the operation of the apparatus in the SiO gas, the manufacturing cost increases almost in proportion to the SiC film thickness.

A graphite material coated with silicon carbide usually comes to the end of its useful life by attachment of splashed molten silicon while the drawing-up operation of single silicon crystals is repeated. Apart from this, the apparatus may become unusable due to damage such as cracks and peeling in SiC films which are caused by physical impact from handling errors or the like during assembling operations or maintenance of the parts.

SUMMARY OF THE INVENTION

SiC films generally having a high resistance against physical impact increase in strength as the film thickness increases. Conventionally, SiC films with a thickness of about 60–150 μm are used. However, a thin film is preferred as a matter of course from the viewpoint of decreasing the manufacturing cost.

Accordingly, an object of the present invention is to provide a graphite material coated with silicon carbide which can overcome the above-mentioned contradictory problems. Another object of the present invention is to provide a graphite material coated with silicon carbide which can be manufactured at a low cost and exhibits a high physical impact resistance.

To achieve the above objective, the graphite material coated with silicon carbide of the present invention comprises a graphite substrate coated with a silicon carbide film with a thickness of 30–50 μm, which is characterized in that there is a mixed layer of graphite and silicon carbide with a thickness of 10–500 μm from the interface of the graphite substrate and the silicon carbide film through the inside of the graphite substrate and further that the silicon carbide film has a peel strength of 5 Mpa or more. The silicon carbide film in the present invention is attached by the chemical vapor deposition (CVD) method and is suitably used as a material for an apparatus for drawing-up single silicon crystals.

BRIEF DESCRIPTION OF THE DRAWING

FIG. 1 is a cross-sectional view diagrammatically showing an apparatus for drawing-up single silicon crystals by the CZ method.

DETAILED DESCRIPTION OF THE INVENTION AND PREFERRED EMBODIMENTS

The graphite material coated with silicon carbide of the present invention is characterized by possessing a mixed layer of graphite and silicon carbide with a thickness of 10–500 μm from the interface of the graphite substrate and the silicon carbide film through the inside of the graphite substrate. Specifically, such a mixed layer structure in which the materials gradiently change from graphite to silicon carbide on the surface of the graphite substrate ensures a strong attachment of the silicon carbide film to the graphite substrate by an anchoring effect of such a mixed layer. As a result, the silicon carbide film is detached or peeled off only with difficulty and, consequently, it is possible to provide a thin film.

The thickness of the mixed layer should be in the range of 10–500 μm because a thickness of less than 10 μm exhibits too small an anchoring effect to ensure a sufficiently strong attachment of an SiC film to the graphite substrate, whereas a thickness of more than 500 μm does not bring about an anchoring effect proportionate to the thickness, only resulting in an increase in the manufacturing cost.

This graphite substrate-SiC film structure, which comprises an external SiC film with a high rigidity and a graphite substrate which is softer than the SiC film and can be microscopically deformed due to its plasticity, enables the material to withstand a physical impact if the SiC film has an adequate thickness. Specifically, a thick SiC film alone can absorb and rebound from stress by its rigidity. However, if the film is thin, the stress reaches the interface of the SiC film and the graphite substrate. As the film thickness decreases, the stress ultimately reaches the graphite substrate. When the stress spreads out to the interface, the SiC film is easily detached from the substrate if the adhesion to the substrate is weak.

The presence of the above-described mixed layer of SiC and graphite with a gradiently differing composition in the present invention maintains the SiC film firmly attached to the graphite substrate, which provides the film with a high resistance to physical impact even if the thickness of the SiC film is reduced. It is thus difficult to detach the film from the substrate. Specifically, the film can be as thin as 30–50 μm. If the thickness of the SiC film is less than 30 μm, the stress applied reaches the graphite substrate and produces cracks therein due to plastic deformation of the graphite. On the other hand, a thick SiC film increases the manufacturing cost. No additional effect proportionate to an added film thickness can be obtained if the film thickness exceeds 30 μm. For these reasons, the SiC film thickness should be controlled in the range of 30–50 μm.

It is thus possible to have an SiC film attached to a graphite substrate with a peel strength of 5 Mpa or more due to an anchoring effect of the mixed layer and the SiC film thickness control. If the peel strength is 5 Mpa or more, the film will not easily exfoliate by ordinary physical impact. The peel strength is a value obtained by a direct pulling method. (D. S. Campbell; Mechanical Properties of thin films, in Handbook of Thin Film Technology, L. I. Maissel and R. Glang Editors, Chapter 12, McGraw Hill, N.Y., pp. 12.6~12.21 (1970))

The SiC film adheres to the surface of the graphite substrate by use of the CVD method. Adhesion of an SiC film by the CVD method can be carried out by a process which comprises: placing a graphite substrate in a CVD reactor, such as an atmospheric thermal CVD reactor or a reduced pressure thermal CVD reactor, exhausting the gas inside the system, replacing the internal atmosphere with hydrogen gas by feeding the hydrogen while heating the system to a prescribed temperature, and feeding a halogenated organic silicon compound such as $CH_3SiCl_3$, $(CH_3)_2SiCl_2$, or $CH_3SiHCl_2$, or a mixture of a silicon compound such as $SiCl_4$ and a carbon compound such as $CH_4$, using hydrogen gas as a carrier gas to perform a vapor phase thermal decomposition reaction, thereby causing SiC to be deposited on the surface of the graphite substrates.

In this instance, the CVD reaction conditions, such as temperature, reaction time, feed rate of raw material gas, ratio of the raw material gas and hydrogen gas, internal pressure of the reactor, etc., are appropriately determined to control the diffusion rate of the raw material gas into pores which are present on the graphite substrate surface, the SiC deposition rate by a vapor phase thermal decomposition reaction, and the like. Properties such as the SiC film adhering to the graphite substrate surface, the thickness of the SiC film, the thickness of the mixed layer, the peel strength of the SiC film, and the like can be controlled in this manner.

Because the graphite material coated with silicon carbide of the present invention is made from a comparatively thin SiC film firmly adhering to the surface of a graphite substrate with a high peel strength, this material can be ideal for use in various parts of the apparatus for drawing-up single silicon crystals, such as a gas rectification pipe, heat shielding member, heat insulating pipe, heater, graphite crucible, and the like. The material is also extremely useful because of its low costs.

EXAMPLES

The present invention will now be described in more detail by way of examples and comparative examples.

Examples 1–3 and Comparative Examples 1–7

An isotropic graphite material with a dimension of 100 mm×100 mm×10 mm was placed in a CVD reactor. After thoroughly replacing the internal atmosphere with hydrogen, raw material gases ($CH_4$ and $SiCl_4$) were fed to the reactor together with hydrogen (a carrier gas) while heating to a prescribed temperature. The CVD reaction was carried out under appropriately established reaction conditions, such as reaction temperature, reaction pressure, ratio of $CH_4/SiCl_4/H_2$, feed rate of the raw material gases, reaction time, and the like, thereby causing an SiC film to adhere to the surface of the isotropice graphite material.

The SiC film thickness, the thickness of the mixed layer of graphite and SiC, and the peel strength of the SiC film were measured using the graphite material coated with silicon carbide thus prepared. The thickness of the mixed layer was determined from the reflection electronic image in the electron microscope, and the peel strength was measured by a direct pulling method. Next, as a simulation test against physical impact, an impact device (weight: 80 g) was dropped from a height of 50 mm from the SiC film surface to measure the diameter of a bruise made by the impact on the surface of SiC film and observe the damage conditions of the SiC film. Results are shown in Table 1.

TABLE 1

|  | SiC film film thickness (μm) | Mixed layer thickness (μm) | Peel strength (MPa) | Diameter of bruise (mm) | Damage conditrions |
| --- | --- | --- | --- | --- | --- |
| Example 1 | 30 | 100 | 10 | 1.8 | Slight |
| Example 2 | 40 | 100 | 10 | 1.5 | Slight |
| Example 3 | 50 | 100 | 10 | 1.3 | Slight |
| Comparative Example 1 | 20 | 100 | 10 | 2.2 | Cracks |
| Comparative Example 2 | 100 | 100 | 10 | 0.8 | Slight |
| Comparative Example 3 | 20 | — | 3 | 3.5 | Peeled [1] |
| Comparative Example 4 | 30 | — | 3 | 3.2 | Peeled [1] |
| Comparative Example 5 | 40 | — | 3 | 2.8 | Peeled [1] |
| Comparative Example 6 | 50 | — | 3 | 2.3 | Peeled [1] |
| Comparative Example 7 | 100 | — | 3 | 0.8 | Slight |

Note:
[1] The color of the bruise has changed into yellow and the SiC film on the bruise has completely peeled off from the graphite substrate as a result of a heat cycle test (room temperature to 1400° C.).

As can be seen from the results shown in Table 1, the graphite materials coated with silicon carbide of the Examples suffer only slightly from the impact which produces only a small bruise on the surface. These materials could be used with no practical problem. On the other hand, a large bruise and cracks were produced by the impact on the material of Comparative Example 1 which had a thin SiC film, suggesting that the use of this material may cause a problem. The diameter of the bruise decreases and the resistance to physical impact is improved as the thickness of the SiC film increases. The material of Comparative Example 2 with a film thickness of 100 μm suffers only very slightly from the impact, but its manufacturing cost is unduly high.

The materials of Comparative Examples 3–7, which do not have a mixed layer of graphite and SiC, exhibited a very small SIC film peel strength. These SiC films were found to be unusable continuously in practice due to the reaction of graphite and SiO gas. As shown in the material of Comparative Example 2, although a film with a thickness of 100 μm suffers only very slightly from the impact, its manufacturing cost is high.

Example 4

The heat shielding member (10) of the apparatus for drawing-up silicon single crystals shown in FIG. 1 was fabricated using the graphite material coated with silicon carbide prepared in Example 2 which has an SiC film thickness of 40 μm, a mixed layer thickness of 100 μm, and a peel strength of 10 MPa. The operation of drawing-up the single silicon crystal was carried out to measure the SiC film life by the number of repetitions of the drawing-up operation.

Example 5

A bolt weighing 10 g was dropped onto the heat shielding member (10) of Example 4 from a height of 50 cm to produce a bruise with a diameter of about 1.6 mm. The operation of drawing-up the single silicon crystal was carried out to measure the bruised SiC film life by the number of repetitions of the drawing-up operation.

Comparative Example 8

The heat shielding member (10) of the apparatus for drawing-up single silicon crystals shown in FIG. 1 was fabricated using the graphite material coated with silicon carbide prepared in Comparative Example 7 having an SiC film thickness of 100 μm with no mixed layer, and having a peel strength 3 MPa. The operation of drawing-up a single silicon crystal was carried out to measure the SiC film life by the number of repetitions of the drawing-up operation.

The results obtained in Examples 4–5 and Comparative Example 8 are shown in Table 2. As shown in Table 2, the heat shielding member of Example 4 prepared from the graphite material coated with silicon carbide of the present invention, which has an SiC film thickness of 40 μm, exhibited a useful life equivalent to the heat shielding member of Comparative Example 8 having a film thickness 100 μm, indicating that the material with a thinner film of the present invention has a longer useful life than a conventional material with a thicker film. The heat shielding member of Example 4 on which a bruise with a diameter of about 1.6 mm was produced by an impact exhibited almost the same useful life, indicating that physical impact from an handling error or the like does not result in damage so serious that the material is rendered unusable.

TABLE 2

|  | Useful life (the number of operations) |
| --- | --- |
| Example 4 | 25–35 |
| Example 5 | 25–33 |
| Comparative Example 8 | 25–35 |

As described above, in the graphite material coated with silicon carbide of the present invention, having a gradiently varying mixed layer structure of graphite and silicon carbide present from the interface of the graphite substrate and the silicon carbide film through the inside of the graphite substrate ensures strong attachment of the silicon carbide film to the graphite substrate by an anchoring effect of such a mixed layer. As a result, the graphite material coated with silicon carbide has a comparatively thin SiC film adhering firmly to the surface of a graphite substrate with a high peel strength, so that this material can be used for various parts such as a gas rectification pipe, heat shielding member, heat insulating pipe, heater, graphite crucible, and the like. The material is also extremely useful because of its low cost.

What is claimed is:

1. A graphite material coated with silicon carbide comprising a graphite substrate coated with a silicon carbide film with a thickness of 30–50 μm, wherein a mixed layer of graphite and silicon carbide with a thickness of 10–500 μm is provided from the interface of the graphite substrate and the silicon carbide film through the inside of the graphite substrate, and the silicon carbide film has a peel strength of 5 Mpa or more.

2. The graphite material coated with silicon carbide according to claim 1, wherein the silicon carbide film is attached by a CVD method.

3. A silicon carbide-coated graphite material comprising a graphite substrate coated with a silicon carbide film having a thickness of 30–50 μm and a mixed layer of graphite and silicon carbide having a thickness of 10–500 μm being provided from the interface of the graphite substrate and silicon carbide film through the inside of the graphite substrate, the mixed layer gradiently changing from graphite to silicon carbide and the silicon carbide film having a peel strength of at least 5 MPa.

4. In an apparatus for drawing-up single crystals of silicon, the improvement comprising said apparatus being made from a material comprising a silicon carbide-coated graphite material, the silicon carbide-coated graphite material comprising a graphite substrate coated with a silicon carbide film having a thickness of 30–50 µm and a mixed layer of graphite and silicon carbide having a thickness of 10–500 µm being provided from the interface of the graphite substrate and silicon carbide film through the inside of the graphite substrate, the silicon carbide film having a peel strength of at least 5 MPa.

5. The apparatus of claim 4, wherein the mixed layer gradiently changes from graphite to silicon carbide.

* * * * *